United States Patent
Ma et al.

(10) Patent No.: US 11,602,081 B2
(45) Date of Patent: Mar. 7, 2023

(54) SYSTEM AND METHOD FOR LOUVER-INTEGRATED DIRECTIONAL AIRFLOW FANS

(71) Applicant: Dell Products L.P., Round Rock, TX (US)

(72) Inventors: Xinzhi Ma, Shanghai (CN); Eric Michael Tunks, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 196 days.

(21) Appl. No.: 17/126,086

(22) Filed: Dec. 18, 2020

(65) Prior Publication Data
US 2022/0201900 A1 Jun. 23, 2022

(51) Int. Cl.
*H05K 7/20* (2006.01)

(52) U.S. Cl.
CPC ..... *H05K 7/20736* (2013.01); *H05K 7/20836* (2013.01)

(58) Field of Classification Search
CPC ... G05B 15/02; G05B 2219/2642; G06F 1/20; G06F 1/206; H05K 7/20836; H05K 7/20727; H05K 7/20172; H05K 7/20181; H05K 7/20209; H05K 7/20736
See application file for complete search history.

(56) References Cited

U.S. PATENT DOCUMENTS

| | | | | |
|---|---|---|---|---|
| 6,975,509 | B2 * | 12/2005 | Osborn | G06F 1/20 165/80.2 |
| 8,939,824 | B1 * | 1/2015 | Bash | F25D 17/045 62/178 |
| 2003/0214782 | A1 * | 11/2003 | Osborn | G06F 1/20 165/80.3 |
| 2010/0057259 | A1 * | 3/2010 | Dawson | G05B 15/02 700/278 |
| 2016/0174413 | A1 * | 6/2016 | Steinbrecher | H05K 7/20727 361/679.51 |
| 2020/0130096 | A1 * | 4/2020 | Ihde | H05K 7/20909 |
| 2021/0396237 | A1 * | 12/2021 | Chen | F04D 25/166 |

* cited by examiner

*Primary Examiner* — Darrin D Dunn
(74) *Attorney, Agent, or Firm* — McDermott Will & Emery LLP

(57) ABSTRACT

A cooling system for a plurality of heat-generating components in a chassis of an information handling system includes an array of fans, each fan operable to generate an airflow in a range of airflows, and a control system configured to monitor temperatures for the components and adjust a direction of one or more airflows based on the component temperatures. If a component temperature gets too high for a first fan associated with the component to cool the component, a portion of a second airflow generated by a second fan may be directed to provide additional airflow to the component such that the component is cooled without increasing the fan speed of the first fan. Adjacent fan speeds may also be adjusted to reduce losses due to differences between adjacent airflows.

17 Claims, 7 Drawing Sheets

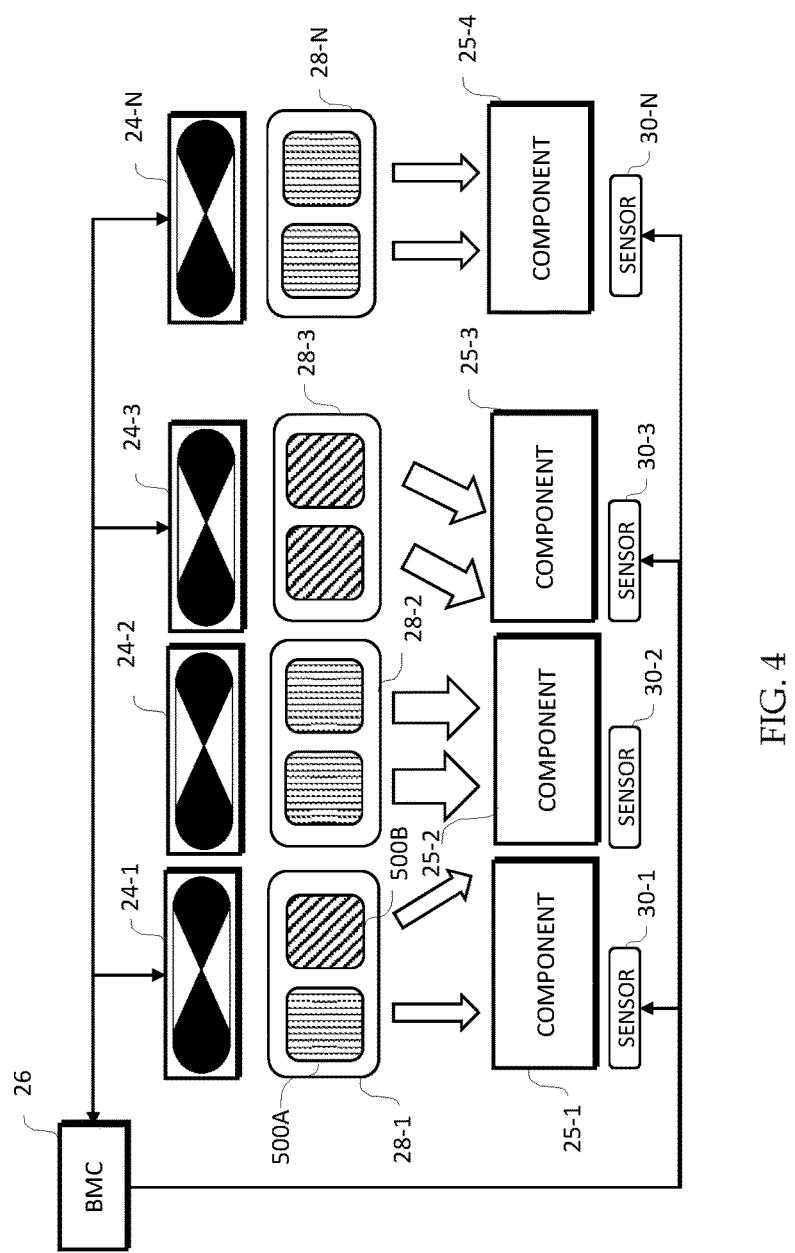

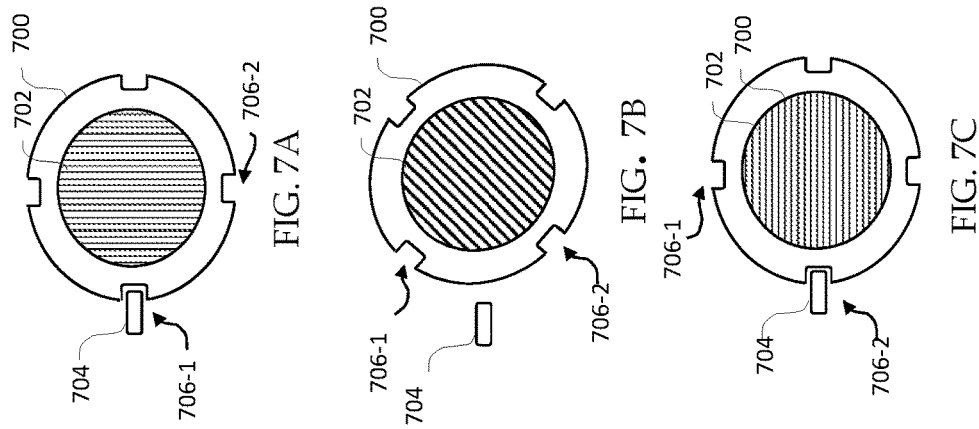
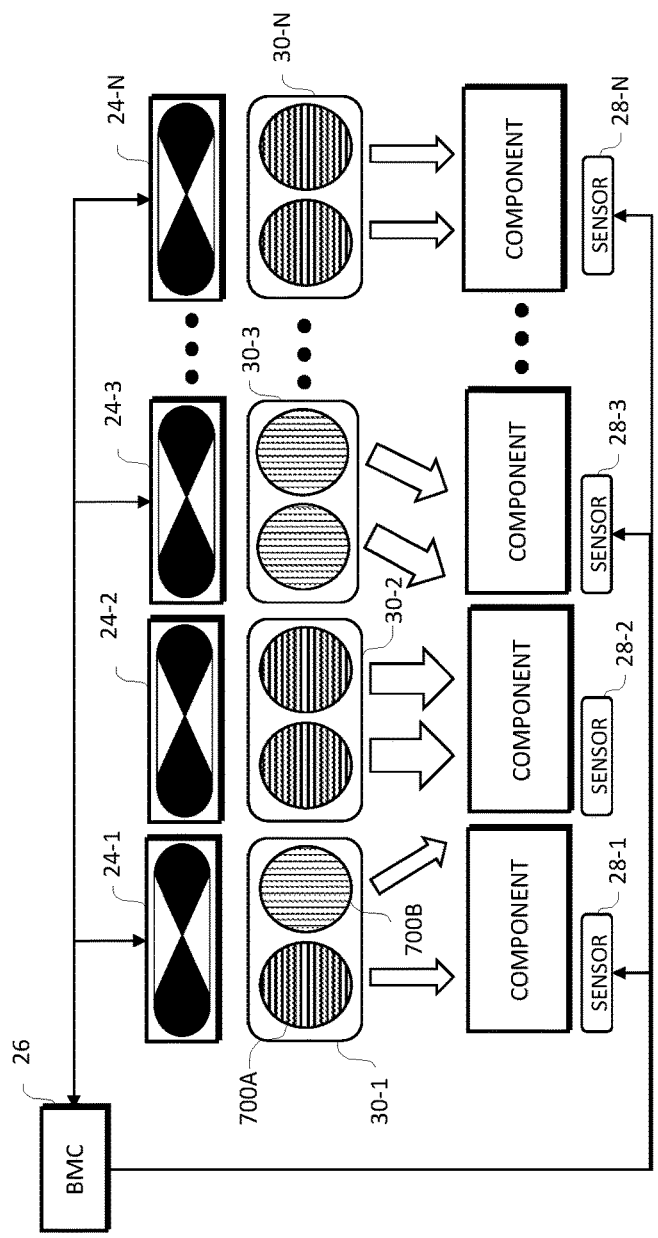

SYSTEM AND METHOD FOR LOUVER-INTEGRATED DIRECTIONAL AIRFLOW FANS

BACKGROUND

Field of the Disclosure

This disclosure relates generally to information handling systems and, more particularly, to louver-integrated directional airflow fans for coordinating multiple airflows in a chassis to cool components of an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Embodiments disclosed herein may be generally directed to information handling systems and systems for coordinating multiple airflows in a chassis to cool components of an information handling system using minimal airflow.

Embodiments disclosed herein may be directed to an information handling system with an array of fans generating multiple airflows in a chassis. The array of fans may be arranged to generate multiple airflows flowing in parallel, wherein all airflows flow in the same direction. Each fan generates an airflow based on a respective fan speed and each fan may be controlled individually to adjust the respective fan speed within a range of fan speeds. The airflows for the array of fans result in a total airflow through the chassis. A controller may adjust the fan speeds of one or more fans to improve cooling of heat-generating components in the chassis without increasing the total airflow of the array of fans or without exceeding a maximum airflow through the chassis.

A plurality of sensors may be configured to detect temperatures for heat-generating components in the information handling system and communicate signals to a controller such as a baseboard management controller (BMC). The processor may receive the temperature signals, determine a first heat-generating component is operating at a high temperature, and adjust the angle of a plurality of slats to redirect at least a portion of an airflow associated with a second component to cool the first component without increasing the total airflow through the information handling system.

BRIEF DESCRIPTION OF THE DRAWINGS

For a more complete understanding of the invention and its features and advantages, reference is now made to the following description, taken in conjunction with the accompanying drawings, in which:

FIG. 4 depicts a diagram of a cooling system, illustrating louvers with sections with slats having an adjustable angle for cooling heat-generating components in an information handling system;

FIGS. 5A and 5B depict embodiments of a section of a louver with an actuator for adjusting an angle of a plurality of slats in the section;

FIG. 6 depicts a diagram of a cooling system, illustrating louvers with rotatable sections for cooling heat-generating components in an information handling system; and FIGS. 7A-7C depict embodiments of a rotatable section with an actuator for changing an angular position of the rotatable section to adjust an angle of a plurality of slats.

DESCRIPTION OF PARTICULAR EMBODIMENT(S)

Figure 1:
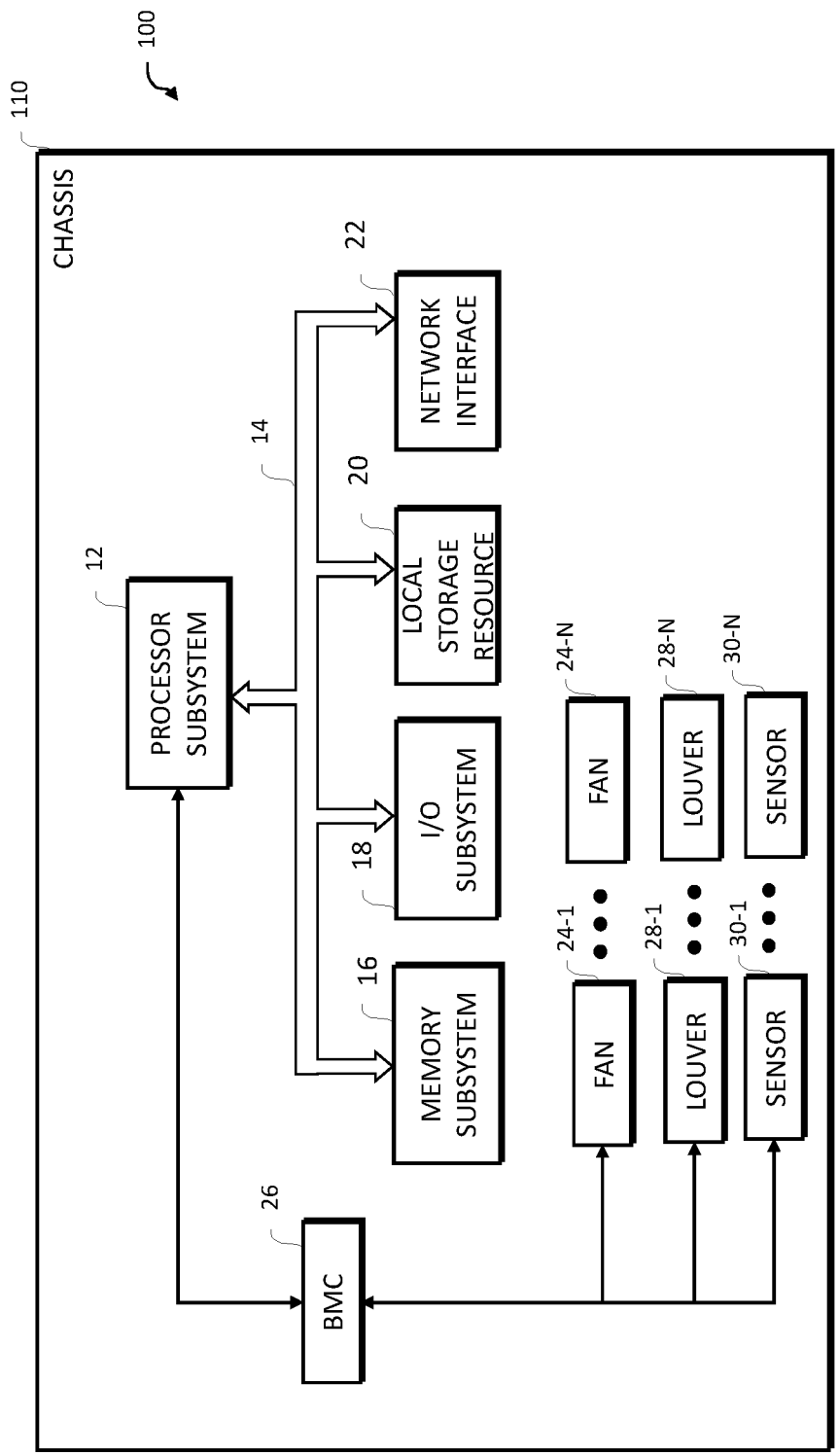
FIG. 1 is a block diagram of selected elements of an embodiment of an information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, fan "24-1" refers to an instance of a fan, which may be referred to collectively as fans "24" and any one of which may be referred to generically as fan "24."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and one or more video displays. The information handling system may also include one or more buses operable to transmit communication between the various hardware components.

In an information handling system, multiple fans arranged in an array may generate multiple airflows, wherein each airflow removes heat from a set of heat-generating components. The array may be arranged with the fans generating parallel airflows.

Embodiments disclosed herein include an information handling system with a cooling system for cooling heat-generating components and a control system for controlling the direction of multiple airflows in the information handling system to effectively cool heat-generating components while minimizing airflow through the chassis.

Embodiments disclosed herein are described with respect to an information handling system in a chassis with an array of fans. Particular embodiments are best understood by reference to FIGS. 1, 2A-2C, 3-4, 5A-5B, 6 and 7A-7C, wherein like numbers are used to indicate like and corresponding parts.

Turning to the drawings, FIG. 1 illustrates a block diagram depicting selected elements of an embodiment of information handling system 100 in chassis 110. It is noted that FIG. 1 is not drawn to scale but is a schematic illustration.

As shown in FIG. 1, components of information handling system 100 may include, but are not limited to, a processor subsystem 12, which may comprise one or more processors, and a system bus 14 that communicatively couples various system components to processor subsystem 12 including, for example, a memory subsystem 16, an I/O subsystem 18, local storage resource 20, and network interface 22. Information handling system 100 may include an array of fans 24 (depicted as fans 24-1 to 24-N) for cooling one or more components of processor subsystem 12, memory subsystem 16, I/O subsystem 18, local storage resource 20, and network interface 22. Each fan 24 generates an airflow, discussed in greater detail below. Each airflow or a portion thereof may be directed by a louver 28 of a plurality of louvers 28-1 to 28-N. BMC 26 communicates with a plurality of sensors 30 (depicted as sensors 30-1 to 30-N) to determine component temperatures inside chassis 110, communicates with fans 24 to control fan speed based on a desired airflow for each fan 24 and communicates with louvers 28 to control a direction of each airflow to cool components in chassis 110.

Processor subsystem 12 may comprise a system, device, or apparatus operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, processor subsystem 12 may interpret and execute program instructions and process data stored locally (e.g., in memory subsystem 16). In the same or alternative embodiments, processor subsystem 12 may interpret and execute program instructions and process data stored remotely (e.g., in a network storage resource).

System bus 14 may refer to a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Memory subsystem 16 may comprise a system, device, or apparatus operable to retain and retrieve program instructions and data for a period of time (e.g., computer-readable media). Memory subsystem 16 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 18 may comprise a system, device, or apparatus generally operable to receive and transmit data to or from or within information handling system 100. I/O subsystem 18 may represent, for example, a variety of communication interfaces, graphics interfaces, video interfaces, user input interfaces, and peripheral interfaces. In various embodiments, I/O subsystem 18 may be used to support various peripheral devices, such as a touch panel, a display adapter, a keyboard, a touch pad, or a camera, among other examples. In some implementations, I/O subsystem 18 may support so-called 'plug and play' connectivity to external devices, in which the external devices may be added or removed while information handling system 100 is operating.

Local storage resource 20 may comprise computer-readable media (e.g., hard disk drive, floppy disk drive, CD-ROM, and other type of rotating storage media, flash memory, EEPROM, or another type of solid-state storage media) and may be generally operable to store instructions and data.

Network interface 22 may be a suitable system, apparatus, or device operable to serve as an interface between information handling system 100 and a network (not shown). Network interface 22 may enable information handling system 100 to communicate over a network using a suitable transmission protocol or standard. In some embodiments, network interface 22 may be communicatively coupled via a network to a network storage resource (not shown). A network coupled to network interface 22 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to network interface 22 may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. A network coupled to network interface 22 or various components associated therewith may be implemented using hardware, software, or any combination thereof.

Components in chassis 110 of information handling system 100 generate heat when processing information. For example, processors such as a central processing unit (CPU), graphics processing unit (GPU) or other processors in processor subsystem 12, memory devices in memory subsystem 16, components of I/O subsystem 18, storage devices in local storage resource 20 and components of network interface 22 generate heat, wherein each component generates heat at a rate based on the component. Furthermore, a component may operate at different levels of processing, resulting in varying levels of heat generation. For example, a GPU may be used for graphics processing, but may also be used for machine learning computations, deep learning computations. A GPU may generate relatively less heat when information handling system 100 is executing an application with low GPU processing requirements but may generate significantly more heat when information handling system 100 is executing an application with high GPU processing requirements. However, the GPU may process information such that it always generates more heat than a memory device.

Minimizing Total Airflow

Figure 2A:
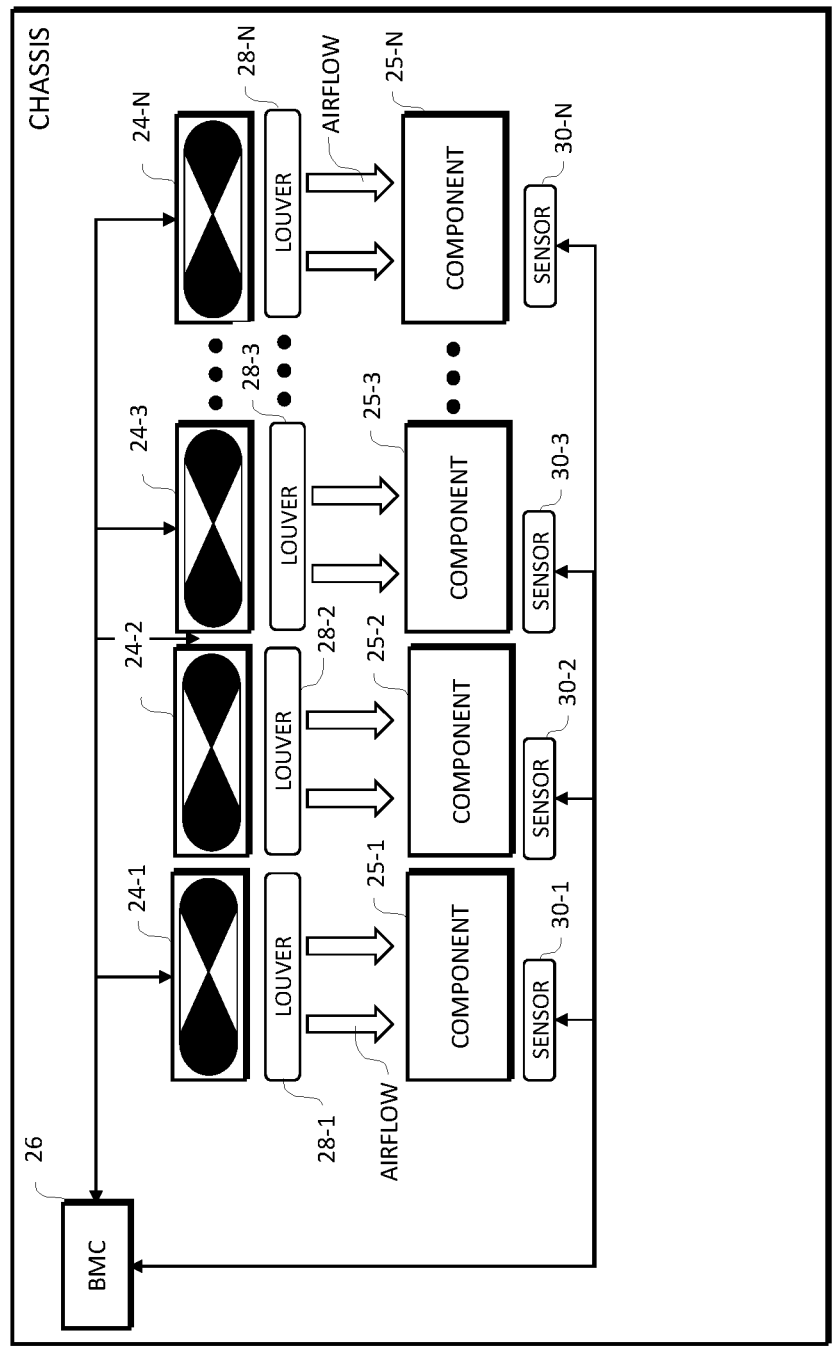
FIGS. 2A-2C depict schematic diagrams of a cooling system for the information handling system depicted in FIG. 1.
Figure 2B:
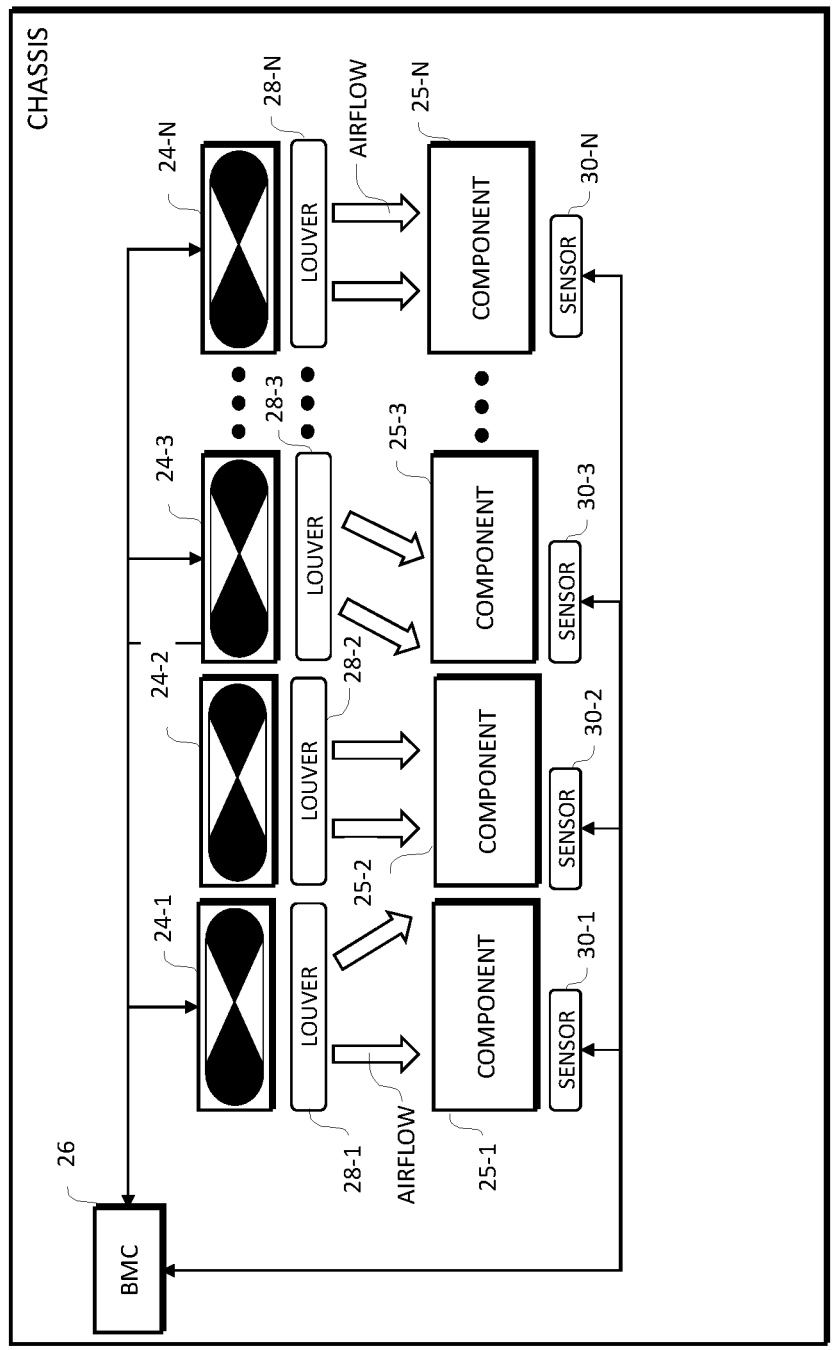
Figure 2C:
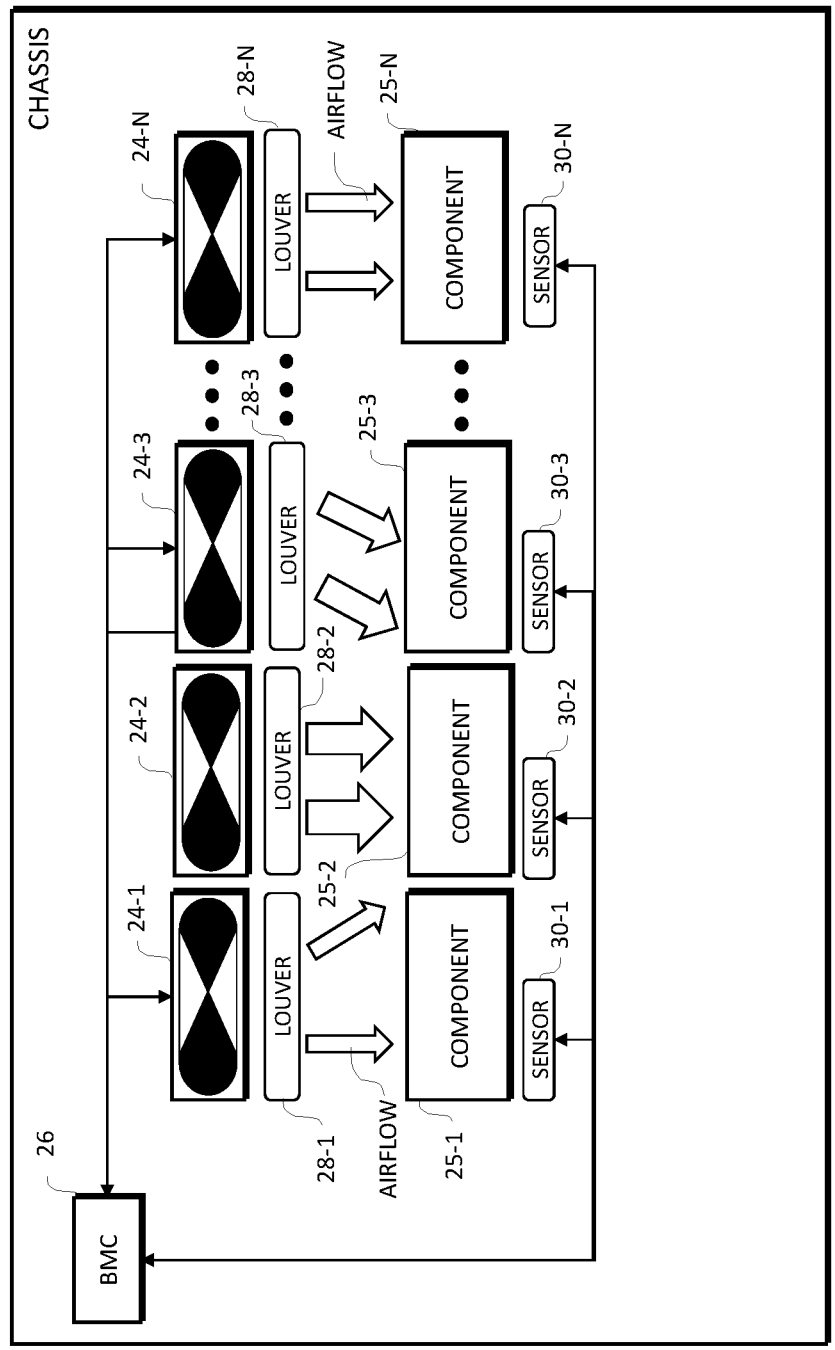

An array of fans 24 may be configured to provide a total airflow through chassis 110. Referring to FIGS. 2A-2C, information handling system 100 may ideally operate with a plurality of fans 24 generating multiple airflows to cool a plurality of heat-generating components 25 of information handling system 100. Heat-generating components 25 may provide the functionality for processor subsystem 12, memory subsystem 16, I/O subsystem 18, local storage resource 20 and network interface 22, for example. In some situations, the total airflow in chassis 110 is not allowed to exceed a maximum total airflow. For example, a server room may use significantly more power if all fans 24 are allowed to operate at maximum fan speeds. BMC 26 may communicate with sensors 30 to ensure all heat-generating components 25 are cooled adequately and control the fan speed of each fan 24 to ensure a total airflow generated by a plurality of fans 24 through chassis 110 does not exceed a maximum airflow, to cool heat-generating components 25 using minimal airflow, or to cool heat-generating components 25 using minimal power.

Redirecting Airflows to Minimize Total Airflow

Still referring to FIGS. 2A-2C, to cool heat-generating components 25 in chassis 110 while minimizing total airflow or power consumption, embodiments may redirect one or more airflows to cool heat-generating components 25 before increasing any fan speeds. Referring to FIG. 2A, BMC 26 may communicate with sensors 28 to determine component temperatures. As depicted in FIG. 2A, BMC 26 may control fan speeds for multiple fans 24-1 to 24-N in an array of fans 24 to generate multiple air flows across heat-generating components 25, wherein each fan 24 is generating a similar airflow (indicated by arrows of substantially identical dimensions) and each louver 28 is directing a corresponding airflow to a heat-generating component 25 or set of heat-generating components 25. Each louver 28 may be configured to direct a corresponding airflow in a default direction to a first heat-generating component 25 such that parallel airflows do not contact each other.

Referring to FIG. 2B, in some situations, one or more heat-generating components 25 may increase heat generation due to increased processing requirements or one more fans 24 may generate reduced airflow. In these situations, a component temperature may exceed a threshold temperature. BMC 26 may communicate with a sensor 30 (e.g., sensor 30-2) to determine a component temperature for heat-generating component 25-2 is above a threshold temperature. BMC 26 may communicate with other or adjacent sensors 30-1 and 30-3 to determine adjacent heat-generating components 25-1 and 25-3 are below their respective threshold temperatures and control one or more louvers 28-1 and 28-3 to direct at least a portion of their respective airflows to cool heat-generating component 25-2. In this scenario, the redirection of airflows from adjacent fans 24-1 and 24-3 to cool heat-generating component 25-2 is possible without increasing the fan speeds of any of fans 24, such that the total airflow through chassis 110 does not increase.

In some situations, redirection of airflows may not be possible or insufficient to cool overheated heat-generating components 25. Referring to FIGS. 2B and 2C, if heat-generating component 25-2 increases processing or otherwise needs additional cooling after airflows are redirected, BMC 26 may increase the fan speeds of one or more fans 24. Referring to FIG. 2C, in some embodiments BMC 26 may communicate with a sensor 30 (e.g., sensor 30-2) to determine a component temperature for heat-generating component 25-2 is above a threshold temperature. BMC 26 may communicate with sensor 30-1 and determine adjacent component 25-1 is below a respective threshold temperature such that a portion of the airflow used to cool heat-generating component 25-1 may be redirected to cool heat-generating component 25-2 without increasing the fan speed of fan 24-1. However, BMC 26 may communicate with sensor 30-3 and determine adjacent heat-generating component 25-3 is near a respective threshold temperature such that redirecting a portion of the airflow generated by fan 24-3 to cool heat-generating component 25-2 could result in heat-generating component 25-3 needing additional airflow. This could cause an unwanted cascading effect in which a portion of each airflow generated by each fan 24 is redirected to cool an adjacent heat-generating component 25. To cool heat-generating component 25-2 and prevent a cascading effect due to redirecting airflows, BMC 26 may adjust louver 28-3 to redirect a portion (or all) of the airflow generated by fan 24-3 to cool heat-generating component 25-2 and increase a fan speed for one or more of fan 24-2 and fan 24-3 (indicated by larger arrows representing their respective airflows) while other fans 24 (e.g., fans 24-1 and 24-N) maintain their fan speeds. In this scenario, the total airflow may increase but only after other options have been considered. Furthermore, the fan speed of a minimum number of fans 24 is increased.

Method of Cooling Components by Redirecting Airflows

Figure 3:
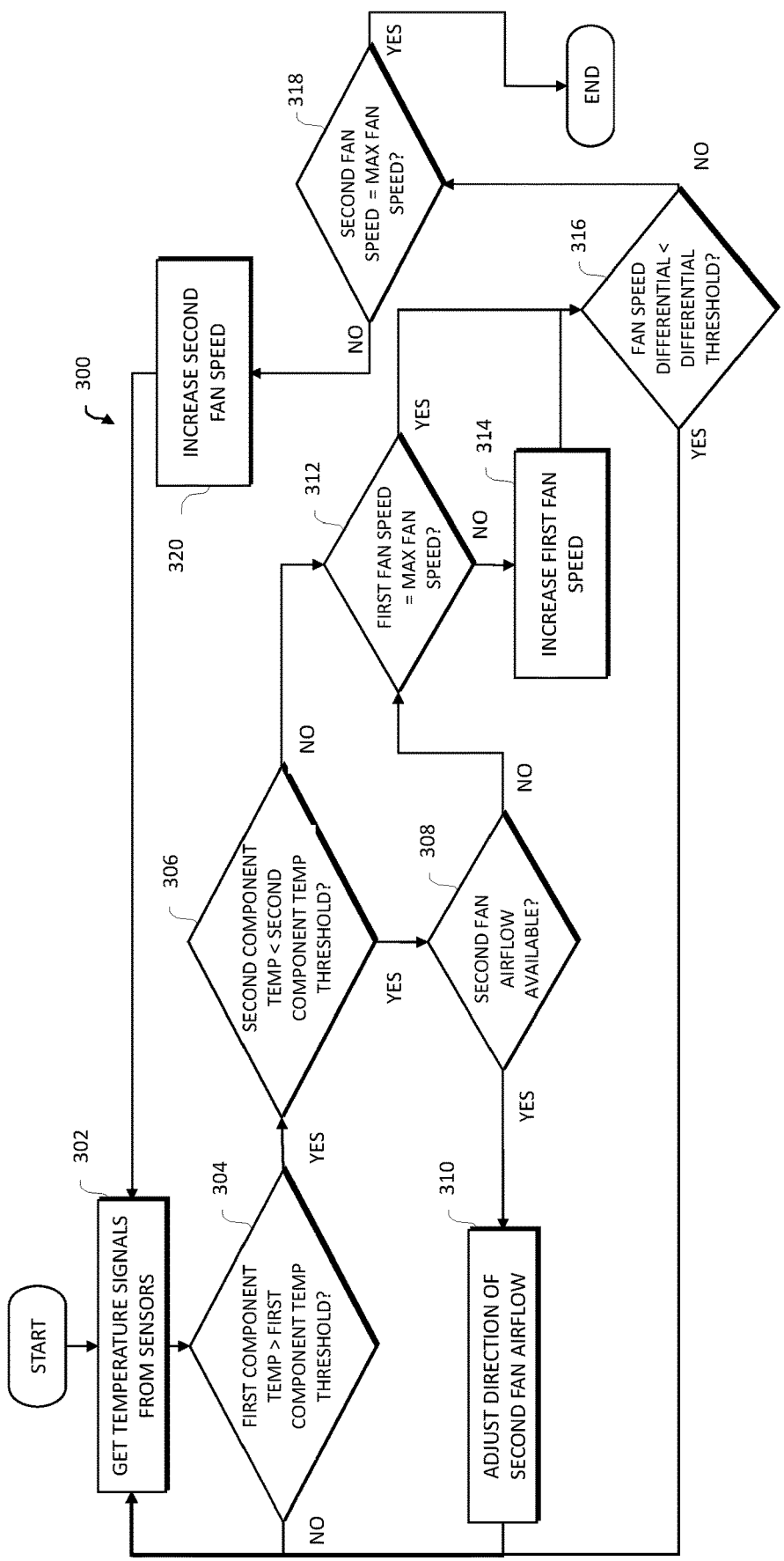
FIG. 3 is a flow diagram depicting a computer-implemented method for cooling heat-generating components in an information handling system.

Turning to FIG. 3, embodiments include a method 300 for controlling an array of fans 24 and a plurality of louvers 28 for cooling heat-generating components 25 in chassis 110. The method may result in effective cooling of heat-generating components 25 in chassis 110 while avoiding or minimizing an increase in the power needed to cool chassis 110 or the airflow through chassis 110.

At step 302, BMC 26 may get temperatures from sensors 30 for heat-generating components 25. In some embodiments, each sensor 30 periodically communicates a temperature signal to BMC 26. In some embodiments, a sensor 30 may be configured to send a temperature signal when a component temperature exceeds a threshold temperature.

At step 304, BMC 26 compares a first component temperature with a corresponding component temperature threshold to determine if the first component temperature is greater than the corresponding component temperature threshold. A component temperature threshold may be stored in a memory medium communicatively coupled to BMC 26, wherein in response to receiving a temperature signal from a sensor 30, BMC 26 may compare the received temperature signal with a component temperature threshold retrieved from the memory medium.

At step 306, if BMC 26 determines the first component temperature is greater than the corresponding component temperature threshold, BMC 26 determines if a second component temperature for an adjacent component 25 is less than its respective component temperature threshold. The second component temperature threshold may differ from the first component temperature threshold. For example, a memory may have a component temperature threshold based on preventing data loss or a data read/write rate, a CPU may have a different component temperature threshold based on processing information and a GPU may have a different component temperature threshold based on performing graphics operations.

At step 308, if BMC 26 determines the second component temperature is less than its respective component temperature threshold, BMC 26 may determine if the second airflow is available for cooling the first component. In some scenarios, a louver 28 associated with an adjacent heat-generating component 25 may have already been adjusted to direct a portion of an adjacent airflow to another heat-generating component 25. In some situations, a fan 24 may be inoperable, removed or otherwise unavailable to generate a second airflow. In some embodiments, BMC 26 may store instructions that specify an airflow generated by a specific fan 24 is only for cooling selected heat-generating components 25. For example, BMC 26 may store instructions that specify an airflow generated by fan 24-N is only for cooling heat-generating component 25-N.

At step 310, if BMC 26 determines a second airflow generated by an adjacent fan 24 is available, BMC 26 may communicate a signal to louver 28 associated with the adjacent fan 24 to adjust the direction of at least a portion of the second airflow to the first heat-generating component 25.

Using steps 302, 304, 306, 308 and 310, embodiments may control louvers 28 to airflow through chassis 110 to effectively cool a plurality of heat-generating components 25 while minimizing the power supplied to an array of fans 24 and minimizing airflow through chassis 110.

In some scenarios, adjusting the direction of a second airflow may be insufficient by itself to ensure all heat-generating components 25 in chassis 110 are cooled. For example, at step 306, BMC 26 may determine the second component temperature is close to the second component temperature threshold such that redirecting a portion of the second airflow away from the second heat-generating component 25 may be detrimental to the performance of the second heat-generating component 25.

In this scenario, at step 312, BMC 26 may determine if the first fan speed is at a maximum first fan speed.

If the first fan speed is less than the maximum fan speed, then at step 314, BMC 26 may increase the first fan speed.

Using steps 302, 304, 306, 308, 310, 312 and 314, embodiments may effectively cool a plurality of heat-generating components 25 while minimizing the power supplied to an array of fans 24 and minimizing airflow through chassis 110. An airflow or a portion of any airflow generated by any of fans 24 may be directed to an adjacent heat-generating component 25 whenever possible such that fan speed for any fan 24 is increased only when an adjacent fan 24 in the array of fans 24 is needed to cool another heat-generating component 25.

Avoiding Pressure or Flow Rate Differentials

In some scenarios, increasing the fan speed of one fan 24 may create a differential that could result in reduced cooling or increased power needed to cool heat-generating components 25 of information handling system 100 in chassis 110. For example, referring to FIG. 2C, fan 24-2 may be operating a maximum second fan speed. If fan 24-3 is operating at 50%, a large fan speed differential may cause airflow from fan 24-2 to collide with airflow from 24-3. The collision may cause turbulence, cause airflow from fan 24-2 to slow down, cause airflow from fan 24-2 or fan 24-3 to recirculate or otherwise reduce the ability of the array of fans 24 to cool heat-generating components 25 in chassis 110. Accordingly, method 300 may comprise steps for preventing unwanted pressure and flow rate differentials that may exist due to fans 24 operating at different speeds.

As mentioned above, at step 314, BMC 26 may communicate a signal to a first fan 24 to increase the first fan speed. BMC 26 may determine if the increased fan speed will cause a pressure or flow rate differential. Alternatively, first fan 24 may already be operating at a maximum fan speed and BMC 26 may determine if increasing a second fan speed will result in a pressure or flow rate differential.

At step 316, BMC 26 may determine if a fan speed differential between adjacent fans 24 is less than a fan speed differential threshold. Ideally the fan speed differential is less than the fan speed differential threshold such that the fan speed of only one fan 24 is increased.

At step 318, BMC 26 may determine if a second fan 24 generating a second airflow is operating at a maximum fan speed.

If there is a large fan speed differential between a first fan 24 and a second fan adjacent the first fan 24 and the second fan 24 is not operating at a maximum fan speed, then at step 320, BMC 26 may communicate a signal to the second fan 24 to increase the second fan speed.

The process may continue as needed to cool heat-generating components 25 in chassis 110. The process may end if the first component temperature is above the first component temperature threshold, the second component temperature is above the second component temperature threshold and the fan speeds of both the first fan 24 and the second fan 24 are equal to a maximum fan speed.

Variations in Louver Design and Operation

Controlling one or more airflows may depend on the configuration of a plurality of slats in one or more louvers 28. Referring to FIGS. 4 and 5A-5B, embodiments of a cooling system for cooling heat-generating components 25 in chassis 110 of information handling system 100 may comprise a plurality of louvers 28 having multiple sections 500 with each section 500 having a plurality of slats 502 that are adjustable to control a direction of an airflow. As depicted in FIG. 4, each louver 28 may comprise two sections 500A and 500B, wherein first section 500A may have a plurality of slats 502 that are configurable to direct a first portion of the airflow generated by fan 24 to a first heat-generating component 25 and second section 500B may have a plurality of slats 502 that are configurable to direct a second portion of the airflow to a second heat-generating component 25. Referring to FIGS. 5A and 5B, a section 500 may comprise a plurality of slats 502, with each slat 502 being adjustable to one of at least two angles. Section 500 may also comprise a linear actuator 504 such as a solenoid coupled to slats 502 for adjusting the angle of slats 502. Actuator 504 may be configurable in a first position (represented by vertical lines in FIG. 5A) to orient slats 502 at a first angle to direct airflow in a first direction to a first heat-generating component 25 and configurable in a second position (represented by diagonal lines in FIG. 5B) to orient slats 502 at a second angle to direct airflow in a second direction to a second heat-generating component 25. Operationally, BMC 26 may receive temperature signals from sensors 30, control fan speeds of fans 24 to generate airflows through chassis 110 and communicate signals to configure a first actuator 504 to orient slats 502 of section 500A at a first angle to direct airflow to a first heat-generating component 25 (e.g., heat-generating component 25-1) and configure a second actuator 504 to orient slats 502 of section 500B at a second angle to direct airflow to an adjacent heat-generating component 25 (e.g., heat-generating component 25-2).

Referring to FIGS. 6 and 7A-7C, embodiments of a cooling system for cooling heat-generating components in chassis 110 of information handling system 100 may comprise a plurality of louvers 28 with one or more rotatable sections 700, wherein rotation of a section 700 adjusts an angle of a plurality of slats 702 to direct an airflow or a portion of an airflow.

As depicted in FIG. 6, each louver 28 may comprise two sections 700A, 700B, wherein section 700A may be rotatable to adjust an angle of a plurality of slats 702 to direct a first portion of the airflow generated by fan 24 to a first heat-generating component 25 (e.g., heat-generating component 25-1) and section 700B may be rotatable to adjust an angle of a plurality of slats 702 to direct a second portion of the airflow to a second heat-generating component 25.

As depicted in FIGS. 7A-7C, each louver 28 may comprise an actuator 704 for selectively positioning in one of multiple recesses 706. Referring to FIG. 7A, each section 700 may have an actuator 704 such as a solenoid configurable in a first position in a first recess 706 (e.g., recess 706-1) to engage section 700 in a first orientation (represented by slats 702 oriented vertically) to direct airflow in a first direction.

Referring to FIG. 7B, actuator 704 may be configurable in a second position outside of any recess 706 such that section 700 is disengaged and able to rotate (represented by slats 702 oriented diagonally). In some embodiments, the shape or orientation of one or more slats 702 may be configured to rotate section 700 when a respective fan 24 is generating an airflow through section 700 and actuator 24 is disengaged from section 700.

Referring to FIG. 7C, actuator 704 may be configurable in the first position but in a second recess 706 (e.g., recess 706-2) to engage section 700 in a second orientation (represented by slats 702 oriented horizontally) to direct airflow in a second direction. Operationally, BMC 26 may receive temperature signals from sensors 30, control fan speeds of fans 24 to generate airflows through chassis 110 and communicate signals to position actuator 704 relative to recesses 706 to direct an airflow. In some embodiments, BMC 26 may determine a first angular position of section 700, determine a target angular position of section 700 based on a cooling requirement for a heat-generating component 25, disengage actuator 704 from a recess 706 in section 700 to allow section 700 to rotate, determine when the angular position of section 700 equals the target angular position and engage actuator 704 in a recess 706 of section 700.

Alternative Systems to Rotate a Section

Embodiments depicted in FIGS. 7A-7C may benefit from one or more position sensors (not shown). In some embodiments (not shown) multiple actuators 704 may be positioned around section 700. Section 700 may have only one recess 706. A signal may be sent to all actuators 704 to configure actuators 704 in the second position such that section 700 is allowed to rotate. A signal may be sent to only one actuator 704 based on the angular position of the actuator 704. As section 700 rotates, the angular position of recess 706 changes. Once section 700 rotates to align recess 706 with the signaled actuator 704, the signaled actuator may advance into recess 706 such that airflow is directed in a desired direction.

In some embodiments (not shown) a stepper motor may be used to control rotation of rotatable sections 700 to provide more precise control of the angle of the plurality of slats 702. In some embodiments, a variable reluctance stepper motor comprises a central rotor surrounded by four electromagnetic field coils. Multiple coils may be connected together as a set so that energizing connected coils will cause the magnetic rotor to align itself with that set of coils. By applying power to each set of coils in turn the rotor can be made to rotate or "step" from one position to the next by an angle determined by its step angle construction, and by energizing the coils in sequence the rotor will produce a rotary motion. The stepper motor driver controls both the step angle and speed of the motor by energizing the field coils in a pulse sequence. The rotor may rotate in one direction (forward) or may rotate in an opposite direction (reverse) by reversing the pulse sequence. The direction of rotation can also be selected along with single step mode or continuous (stepless) rotation in the selected direction. In some embodiments, when using an 8-bit digital controller, 256 micro steps per step are also possible.

Embodiments may have numerous advantages, including but not limited to the following:

Servers can be designed to change the fan airflow direction accordingly when the load of the different devices changes to meet the cooling requirements of different areas in the server system. This minimizes fan power and server airflow.

Reduce the number of air ducts for the specific system configurations. Reduction in server cost as well as cost of managing multiple part numbers.

Better handling of fan failure events.

Minimizing the thermal risk to specific components.

Cost reduction and improve the TCO of the server. For one example, in order to meet an airflow requirement in a GPU area of the chassis 110, it is often necessary to use a High Performance Rotation (HPR) fan with existing fan methods. However, because embodiments may direct additional airflows from louver-integrated directional airflow fans in other areas, the fan requirement may be reduced to allow a Normal Performance Rotation (NPR) fan.

Because of the introduction of real-time control of the airflow direction, the server design using louver-integrated directional airflow fans can adjust the airflow in real time, thereby achieving a more efficient thermal solution. The effect may be comparable to using air ducts specially designed for GPU configurations, but also allows information handling system 100 to adjust for modifications and replacement components and configurations.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A computer-implemented method for cooling a chassis of an information handling system, the method comprising:
   determining a temperature of a first heat-generating component cooled by a first fan of an array of fans is greater than a first component temperature threshold;

determining a temperature of a second heat-generating component near the first heat-generating component is less than a second component temperature threshold, wherein the second heat-generating component is cooled by a second fan of the array of fans;

determining a first fan speed of the first fan generating a first airflow toward the first heat-generating component;

determining fan speed of the second fan generating a second airflow toward the second heat-generating component;

determining a difference between the second component temperature and the second component temperature threshold; and in response to determining the difference between the second component temperature and the second component temperature threshold is greater than the minimum difference, adjusting a louver corresponding to the second fan to redirect at least a portion of the second airflow to the first heat-generating component based on the first component temperature, the second component temperature, the first fan speed and the second fan speed; or in response to determining between the second component temperature and the second component temperature threshold is less than the minimum difference, increasing one or more of the first fan speed and the second fan speed.

2. The computer-implemented method of claim 1, wherein:

the louver comprises a plurality of slats; and adjusting the louver comprises adjusting an angle of the plurality of slats corresponding to the at least portion of the second airflow.

3. The computer-implemented method of claim 2, wherein adjusting the angle of the plurality of slats comprises sending a signal to an actuator associated with the plurality of slats, wherein a first signal causes the actuator to orient the plurality of slats at a first angle to direct the at least portion of the second airflow to the second heat-generating component and a second signal causes the actuator to orient the plurality of slats at a second angle to direct the at least portion of the second airflow to the first heat-generating component.

4. The computer-implemented method of claim 3, wherein:

the plurality of slats form part of a rotatable section and are configured to bias the rotatable section to rotate in the second airflow; and adjusting the angle of the plurality of slats comprises:

determining a first angular position of the rotatable section;

determining a second angular position of the rotatable section associated with directing the at least portion of the second airflow to the first heat-generating component;

sending a first signal to an actuator, the first signal causing the actuator to disengage the rotatable section to allow the rotatable section to rotate to the second angular position; and sending a second signal to the actuator, the second signal causing the actuator to engage the rotatable section to maintain the rotatable section at the second angular position.

5. The computer-implemented method of claim 1, wherein increasing a fan speed of one or more of the first fan and the second fan comprises:

communicating with the first fan to increase the first fan speed based on the first component temperature; and communicating with the second fan to increase the second fan speed based on one or more of the difference between the second component temperature and the second component temperature threshold being less than the minimum difference and an airflow differential between the first airflow and the second airflow being less than an airflow differential threshold.

6. A cooling system for a plurality of heat-generating components in a chassis of an information handling system, the cooling system comprising:

an array of fans for cooling the plurality of heat-generating components, each fan of the array of fans configurable to operate at a fan speed in a range of fan speeds to generate an airflow based on the fan speed;

a plurality of louvers, each louver corresponding to a fan of the array of fans;

a plurality of sensors; and a baseboard management controller (BMC) comprising:

a processor; and a memory medium storing a set of instructions executable by the processor to:

communicate with the plurality of sensors to receive temperature signals associated with the plurality of heat-generating components;

determine a first component temperature of a first heat-generating component of the plurality of heat-generating components is greater than a first component temperature threshold;

determine a second component temperature of a second heat-generating component of the plurality of heat-generating components is less than a second component temperature threshold;

determine a first fan speed of a first fan of the array of fans, the first fan generating a first airflow directed toward the first heat-generating component;

determine a second fan speed of a second fan of the array of fans, the second fan generating a second airflow directed toward the second heat-generating component;

determine if a difference between the second component temperature and the second component temperature threshold is greater than a minimum difference;

if the difference between the second component temperature and the second component temperature threshold is greater than the minimum difference, adjust a louver of the plurality of louvers to redirect at least a portion of the second airflow to the first heat-generating component based on the first component temperature, the second component temperature, the first fan speed and the second fan speed; and if the difference between the second component temperature and the second component temperature threshold is less than the minimum difference, communicate a signal to increase a fan speed of one or more of the first fan and the second fan.

7. The cooling system of claim 6, wherein each louver comprises:

a plurality of sections, each section comprising a plurality of slats; and an actuator for changing an angle of the plurality of slats in each section, wherein the BMC is configured to send a signal to the actuator to adjust the plurality of slats to direct the at least portion of the second airflow to the first heat-generating component.

8. The cooling system of claim 7, wherein:
the plurality of slats have a fixed angle and form part of a rotatable section, wherein the fixed angle causes the rotatable section to rotate in the second airflow, wherein an angular position of the rotatable section determines a direction of the second airflow;
the actuator is configurable in a first position to disengage the rotatable section to allow rotation of the rotatable section and configurable in a second position to engage the rotatable section to prevent rotation of the rotatable section; and
the BMC is configured to:
  determine a first angular position of the rotatable section;
  determine a second angular position of the rotatable section associated with directing the second airflow to the first heat-generating component;
  send a first signal to configure the actuator in the first position to allow the second airflow to rotate the rotatable section to the second angular position; and
  send a second signal to configure the actuator in the second position to maintain the rotatable section at the second angular position.

9. The cooling system of claim 7, wherein:
the plurality of slats have an adjustable angle;
the actuator is configurable to adjust the angle of the plurality of slats; and
the BMC is configured to:
  send a first signal to the actuator to adjust the angle of the plurality of slats in a first section to direct the at least portion of the second airflow to the first heat-generating component; and
  send a second signal to the actuator to adjust the angle of the plurality of slats in a second section to direct the at least portion of the second airflow to the second heat-generating component.

10. The cooling system of claim 7, wherein the BMC is configured to communicate with the actuator to direct the at least portion of the second airflow to the first heat-generating component based on determining the first fan is not operating.

11. The cooling system of claim 6, wherein the BMC is configured to:
communicate with the first fan to increase the first fan speed based on the first component temperature;
calculate an airflow differential between the first airflow and the second airflow; and
communicate with the second fan to increase the second fan speed based on one or more of the difference between the second component temperature and the second component temperature threshold being less than the minimum difference and the airflow differential being less than an airflow differential threshold.

12. An information handling system, comprising:
a plurality of heat-generating components;
an array of fans for cooling the plurality of heat-generating components, each fan configurable to operate at a fan speed in a range of fan speeds to generate an airflow in a range of airflows;
a plurality of louvers, each louver corresponding to a fan of the array of fans; and
a baseboard management controller (BMC) comprising:
  a processor; and
  a memory medium storing a set of instructions executable by the processor to:
    communicate with a plurality of sensors to receive temperature signals associated with the plurality of heat-generating components;
    determine a first component temperature of a first heat-generating component of the plurality of heat-generating components is greater than a first component temperature threshold;
    determine a second component temperature of a second heat-generating component of the plurality of heat-generating components is less than a second component temperature threshold;
    determine a first fan speed of a first fan of the array of fans, the first fan generating a first airflow to cool the first component;
    determine a second fan speed of a second fan of the array of fans, the second fan generating a second airflow to cool the second component;
    determine if a difference between the second component temperature and the second component temperature threshold is greater than a minimum difference;
    if the difference between the second component temperature and the second component temperature threshold is greater than the minimum difference, adjust a louver of the plurality of louvers to redirect at least a portion of the second airflow to the first heat-generating component based on the first component temperature, the second component temperature, the first fan speed and the second fan speed; and
    if the difference between the second component temperature and the second component temperature threshold is less than the minimum difference, communicate a signal to increase a fan speed of one or more of the first fan and the second fan.

13. The information handling system of claim 12, wherein each louver comprises:
a plurality of sections, each section comprising a plurality of slats; and
an actuator for changing an angle of the plurality of slats, wherein the BMC is configured to send a signal to the actuator to adjust the plurality of slats to direct the at least portion of the second airflow to the first heat-generating component.

14. The information handling system of claim 13, wherein:
the plurality of slats have a fixed angle and form part of a rotatable section, wherein the fixed angle causes the rotatable section to rotate in the second airflow, wherein an angular position of the rotatable section determines a direction of the second airflow;
the actuator is configurable in a first position to disengage the rotatable section to allow rotation of the rotatable section and configurable in a second position to engage the rotatable section to prevent rotation of the rotatable section; and
the BMC is configured to:
  determine a first angular position of the rotatable section;
  determine a second angular position of the rotatable section associated with directing the second airflow to the first component;

send a first signal to configure the actuator in the first position to allow the second airflow to rotate the rotatable section to the second angular position; and send a second signal to configure the actuator in the second position to maintain the rotatable section at the second angular position.

15. The information handling system of claim 13, wherein:

the plurality of slats have an adjustable angle;

the actuator is configurable to adjust the angle of the plurality of slats; and the BMC is configured to:

send a first signal to the actuator to adjust the angle of the plurality of slats in a first section to direct the at least portion of the second airflow to the first heat-generating component; and send a second signal to the actuator to adjust the angle of the plurality of slats in a second section to direct the at least portion of the second airflow to the second heat-generating component.

16. The information handling system of claim 13, wherein the BMC is configured to communicate with the actuator to direct the at least portion of the second airflow to the first heat-generating component based on determining the first fan is not operating.

17. The information handling system of claim 12, wherein the BMC is configured to:

communicate with the first fan to increase the first fan speed based on the first component temperature;

calculate an airflow differential between the first airflow and the second airflow; and communicate with the second fan to increase the second fan speed based on one or more of the difference between the second component temperature and the second component temperature threshold being less than the minimum difference and the airflow differential being less than an airflow differential threshold.

* * * * *